US011508391B2

(12) United States Patent
Hassel

(10) Patent No.: US 11,508,391 B2
(45) Date of Patent: Nov. 22, 2022

(54) DEVICE TO AMPLIFY AND CLARIFY VOICE

(71) Applicant: HearMe Technology LLC, Longmont, CO (US)

(72) Inventor: Michael J. Hassel, Longmont, CO (US)

(*) Notice: Subject to any disclaimer, the term of this patent is extended or adjusted under 35 U.S.C. 154(b) by 0 days.

(21) Appl. No.: 17/331,799

(22) Filed: May 27, 2021

(65) Prior Publication Data
US 2021/0375302 A1 Dec. 2, 2021

Related U.S. Application Data

(60) Provisional application No. 63/032,228, filed on May 29, 2020.

(51) Int. Cl.
*G10L 21/0364* (2013.01)
*H04R 1/40* (2006.01)
(Continued)

(52) U.S. Cl.
CPC .......... *G10L 21/0364* (2013.01); *G06F 3/165* (2013.01); *G10L 21/0232* (2013.01); *G10L 21/034* (2013.01); *H03G 3/3005* (2013.01); *H04R 1/025* (2013.01); *H04R 1/403* (2013.01); *H04R 1/406* (2013.01); *H04R 3/005* (2013.01); *H04R 3/12* (2013.01); *H04R 5/02* (2013.01); *H04R 5/027* (2013.01); *H04R 5/04* (2013.01); *H04S 1/007* (2013.01); *G10L 2021/02082* (2013.01); *G10L 2021/02166* (2013.01); *H04R 2201/401* (2013.01); *H04R 2420/07* (2013.01);
(Continued)

(58) Field of Classification Search
CPC ..... H04R 2201/401; H04R 3/12; G10L 21/02; G10L 21/0364

USPC .. 381/26, 27, 28, 80, 91, 92, 122, 300, 303, 381/355
See application file for complete search history.

(56) References Cited

U.S. PATENT DOCUMENTS 5,680,465 A * 10/1997 Boyden ................ H04R 5/0335
381/370

FOREIGN PATENT DOCUMENTS

CN 107889002 * 4/2018 ............... H04B 5/00

OTHER PUBLICATIONS

American Speech Language and Hearing Association, (https://www.asha.org/practice-portal/clinical-topics/dysarthria-n-adults/).
(Continued)

*Primary Examiner* — Yosef K Laekemariam
(74) *Attorney, Agent, or Firm* — Lathrop GPM LLP; Douglas Link

(57) ABSTRACT

A voice enhancing device amplifies and clarifies the voice of a user with hypophonia or other voice issues. The device includes a collar of either rigid or a soft material that is shaped to comfortably sit on the shoulders of the user. One or more microphone arrays are adjustably mounted to the collar to capture audio of the user talking. An electronics module enhances the captured audio signal and generates an enhanced audio signal that drives at least one speaker adjustably attached to the collar. The electronic controller implements one or more of an AGC amplifier to correct amplitude variation in spoked words, adaptive filtering to actively filter out background noise, a variable attack and decay function to improve intelligibility of the spoken words, a diphthong modification function to clarify the spoken words, and an echo cancelation function to reduce echo and feedback in the enhanced audio.

20 Claims, 7 Drawing Sheets

(51) Int. Cl.
| | |
|---|---|
| H04R 3/00 | (2006.01) |
| H04R 3/12 | (2006.01) |
| G06F 3/16 | (2006.01) |
| H04S 1/00 | (2006.01) |
| H04R 1/02 | (2006.01) |
| H04R 5/02 | (2006.01) |
| H04R 5/04 | (2006.01) |
| H04R 5/027 | (2006.01) |
| G10L 21/034 | (2013.01) |
| H03G 3/30 | (2006.01) |
| G10L 21/0232 | (2013.01) |
| G10L 21/0208 | (2013.01) |
| G10L 21/0216 | (2013.01) |

(52) U.S. Cl.
CPC ...... H04R 2430/01 (2013.01); H04S 2400/13 (2013.01); H04S 2400/15 (2013.01)

(56) References Cited

OTHER PUBLICATIONS

M.S. Hawley, P. Enderby, P. Green, S. Cunningham, S. Brownsell, J. Carmichael, M. Parker, A. Hatzis, P. O'Neill, R. Palmer,"A speech-controlled environmental control system for people with severe dysarthria," Medical Engineering & Physics 29 (5),586-593,2007.

B. O'Keefe, N. Kozak, and R. Schuller, "Research priorities in augmentative and alternative communication as dentified by people who use AAC and their facilitators," Augmentative Alternative Commun., vol. 23, No. 1, pp. 89-96, 2007.

J. Murphy, "I prefer contact this close: Perceptions of AAC by people with motor neurone disease and their communication partners," Augmentative Alternative Commun., vol. 20, pp. 259-271, 2004.

J. Todman, N. Alm, J. Higginbotham, and p. File, "Whole utterance approaches in AAC," Augmentative Alternative Commun., vol. 24, No. 3, pp. 235-254, 2008.

J. Todman, "Rate and quality of conversations using a text-storage AAC system: Single-case training study," Augmentative Alternative Commun., vol. 16, No. 3, pp. 164-179, 2000.

J.P. Hosom, A.B. Kain, T. Mishra, J.P.H. van Santen, M. Fried-Oken., J. Staehely, "Intelligibility of modifications to dysarthric speech,"Proceedings of the IEEE International Conference on Acoustics, Speech, and Signal Processing (ICASSP '03), 2003.

C. Atkinson-Clement et al., "Psychosocial Impact of Dysarthria: The Patient-Reported Outcome as Part of the Clinical Management," Neurodegener Dis. 2019.

Kristin Rosen and Sasha Yampolsky, "Automatic speech recognition and a review of its functioning with dysarthric speech," Augmentative and Alternative Communication, 16:1,48-60, 2000.

L. J. Ferrier, H. C. Shane, H. F. Ballard, T. Carpenter, and A. Benoit, "Dysarthric speakers' intelligibility and speech characteristics in relation to computer speech recognition," Augmentative Augmentative Alternative Commun., vol. 11, No. 3, pp. 165-175, 1995.

N. Thomas-Stonell,A.L.Kotler, H.A. Leeper, and P. C. Doyle, "Computerized speech recognition: Influence of ntelligibility and perceptual consistency on recognition accuracy," Augmentative Alternative Commun., vol. 14, No. 1, op. 51-56, 1998.

R. Rodman, T. Moody, J. Price, "Speech recognizer performance with dysarthric speakers: a comparison of two training procedures," Speech Technology 1, 65-71, 1985.

United Nations, "Worid Population Ageing," (https://www.un.org/en/development/desa/population/publications/pdf/ageing/WPA2017_Highlights.pdf).

Y. Bejot, K. Yaffe, "Ageing Population: A Neurological Challenge," Neuroepidemiology, 52:76-77,2019.

GBD 2015 Neurological Disorders Collaborator Group , "Global, regional, and national burden of neurological disorders Turing 1990-2015: a systematic analysis for the Global Burden of Disease Study 2015," The Lancet Neurology, vol. 16, Issue 11, p877-897, 2017.

GBD 2016 Parkinson's Disease Collaborators, "Global, regional, and national burden of Parkinson's disease, 1990-2016: a systematic analysis for the Global Burden of Disease Study 2016," The Lancet Neurology, vol. 17, Issue 11,p939-953, 2018.

Public Health Agency of Canada, "Mapping Connections: An Understanding of Neurological Conditions in Canada," (https://www.canada.ca/content/dam/phac-aspc/migration/phac-aspc/publicat/cd-mc/mc-ec/assets/pdf/mc-ec-eng.pdf).

C. Marras, J.C. Beck, J.H. Bower, et al. "Prevalence of Parkinson's disease across North America," npj Parkinson's Disease 4, 21, 2018.

Fact.Mr, "Speech Generating Devices Market Forecast, Trend Analysis & Competition Tracking: Global Market nsights 2017 to 2022," (https://www.factmr.com/report/53/speech-generating-devices-market).

M S. Hawley, P. Enderby, P.Green, S. Cunningham, R. Palmer, "Development of a Voice-Input Voice-Output Communication Aid (VIVOCA) for People with Severe Dysarthria," International Conference on Computers for Handicapped Persons, (http://www.catch.org uk/past-project/vivoca/).

P. Raghavendra, E. Rosengren, S. Hunnicutt, "An investigation of different degrees of dysarthric speech as input to speaker-adaptive and speaker-dependent recognition systems," Augmentative and Alternative Communication (AAC) 17(4), 265-275, 2001.

Fadi Biadsy and Ron J. Weiss and Pedro J. Moreno and Dimitri Kanevsky and Ye Jia, "Parrotron: An End-to-End Speech-to-Speech Conversion Model and its Applications to Hearing-Impaired Speech and Speech Separation," 2019, arxiv: 1904.04169.

X. Menendez-Pidal, J. B. Polikoff, S. M. Peters, J. E. Leonzio and H. T. Bunnell, "The Nemours database of dysarthric speech," Proceeding of Fourth International Conference on Spoken Language Processing, 1996.

F. Rudzicz, "Adjusting dysarthric speech signals to be more intelligible," Computer Speech & Language vol. 27, Bsue 6, Sep. 2013, pp. 1163-1177.

Franzini, K. Lee and A. Waibel, "Connectionist Viterbi training: a new hybrid method for continuous speech Yecognition," International Conference on Acoustics, Speech, and Signal Processing, Albuquerque, Nm, USA, 1990, pp. 425-428 vol. 1, doi: 10.1109/ICASSP.1990.115733.

Ray D. Kent, Gary Weismer, Jane F. Kent, and John C. Rosenbek, "Toward Phonetic Intelligibility Testing in Dysarthria," Journal of Speech and Hearing Disorders, vol. 54, 482-499, Nov. 1989.

N. Yang, J.L. Hamilton, C. Kopil et al. "Current and projected future economic burden of Parkinson's disease in the U. S.,". npj Parkinsons Dis. 6, 15 2020 https://doi.org/10.1038/s41531-020-0117-1.

http://www.es. toronto.edu/~complingweb/data/TORGO/torgo.html.

A. C. Younkin and p. J. Corriveau, "Determining the Amount of Audio-Video Synchronization Errors Perceptible to the Average End-User," in IEEE Transactions on Broadcasting, vol. 54, No. 3, pp. 623-627, Sep. 2008.

P. Enderby, J. Emerson, "Speech and language therapy: does it work?," BMJ ; 312:1655 1996.

* cited by examiner

DEVICE TO AMPLIFY AND CLARIFY VOICE

CROSS-REFERENCE TO RELATED APPLICATION

This Patent Application claims priority to U.S. Patent Application No. 63/032,228, filed on May 29, 2020, titled "Device to Amplify and Clarify Voice," which is incorporated herein by reference, in its entirety.

BACKGROUND

Hypophonia is a common symptom of neurological disorders including Parkinson's and Multiple sclerosis. The patient (the talker) loses the ability to speak above a whisper and can't communicate. Often the underlying condition makes it difficult for the patient to articulate. The condition affects the mouth the tongue and other parts of the patient's articulation system, making mere amplification of the generated sound insufficient to make the speech intelligible.

Personal public-address (PA) devices, such as those used by teachers and tour guides, have been used to mitigate the issue. However, these devices often lack the amplification needed to be effective and/or they cause feedback and howl when the amplification is increased to a level where the amplitude of the output is effective. In noisy environments, such as when traveling in an automobile and when in an ICU, such devices tend to also amplify the background noise making intelligibility of the patient worse instead of better.

Generally, the personal PA devices do not use directional microphones because omnidirectional microphones are less sensitive to the subject turning their head, however, omni directional microphones pick up more ambient (e.g., background) sound. The form factor of most of these personal PA devices is a box that clips onto a belt or that is worn like a fanny pack. These form factors do not work well when people are sitting down. People with neurological disorders severe enough to need amplification devices generally spend much of their time seated.

SUMMARY OF THE EMBODIMENTS

The embodiments described herein relate to the unique position of microphone and speaker to allow a wearable system for people with the inability to speak loudly and consistently. Embodiments described herein include a plurality of microphones directed at the wearer and a speaker directed toward a listener. Embodiments described herein include amplification and signal processing to clarify the voice and allow focusing of the microphone and attenuate feedback and attenuate background noise.

Embodiments described herein include a collar. As an example, the collar is formed of either solid material, such as plastic, or a soft material such as fabric with a batting that fits like a scarf. The collar supports one or more speakers positioned on the wearer, one or more microphone arrays, and electronics to amplify and process the sound.

In embodiments, the speaker(s) are mounted on a pivot so that it can be twisted to point at a listener to be used in a car or when seated in a toward a listener in a fixed position from the talker. The focus of the microphone is such that the speakers are attenuated by the focus, ideally at 180 degrees. As an example, with two speakers and microphone arrays, the associated signals are crossed so that audio captured by the left microphone is played through the right speaker and audio captured by the right microphone is played through the left speaker. This gives additional separation between microphone and speaker reducing the tendency to howl.

In certain embodiments, the placement of the collar and associated components is configured to increase a signal to noise ratio of an audio signal captured from the wearer. Minimizing distance between the microphone and the mouth of the talker increases the signal to noise of the system. This can be accomplished mechanically by extending the collar up toward the talker with an Elvis collar, having fold up mics, or use of a horn arrangement to focus the sound from the talker. The present embodiments also acknowledge that, for some wearers, manipulating the collar can be cumbersome where the wearer has reduced motor skills due to their medical condition, age, etc. As such, in some embodiments, the microphone is positioned on the collar so that the wearer does not need to adjust it to fit. In such embodiments, for example, the signal-to-noise ratio is additionally or alternatively increased electronically as opposed to mechanically, where the collar includes a plurality of microphones to beam form the pickup pattern thereof.

The signal processing system helps amplify and clarify the voice captured by the microphones. Firmware routines (implemented as software comprising machine readable instructions that when executed by one or more processors control the device according to the functionality described herein, hardware, or a combination thereof) within the device beamform the signals received by the microphone to focus the pickup pattern. The signals are sent through an Automatic Gain Control with thresholding to provide a constant amplitude through the speakers. It is a common symptom of Parkinson's for the talker to start out at a reasonable amplitude but taper off to a whisper by the end of a sentence. The AGC will correct this. Adaptive filtering will reduce the amplification of background noise. The attack and decay circuitry changes the amplitude within words to help intelligibility. Finally, electronic diphthong modification will improve intelligibility of diphthongs within words.

In certain embodiments, a voice enhancement device includes (a) a collar defining a central opening and a front gap between a right arm and a left arm, the collar being shaped and sized to comfortably sit and be retained about a neck and shoulders of a user of the voice enhancement device, (b) a right speaker positioned at a right upper surface of a right distal end of the right arm, (c) a left speaker positioned at a left upper surface of a left distal end of the left arm, (d) a right microphone array including a plurality of right microphones positioned at the right upper surface of the right arm, (e) a left microphone array including a plurality of left microphones positioned at the left upper surface of the left arm; and (f) an electronic controller housed within the collar. The electronic controller including at least one digital signal processor (DSP), and memory storing machine-readable instructions that when executed by the DSP, control the DSP to: implement a right channel for processing right input audio signals from the right microphone array and generating a first enhanced audio signal, the right channel including a right-channel beam forming function, a right-channel automatic gain control amplifier with thresholding, a right-channel adaptive filter, a right-channel attack/decay function, a right-channel diphthong modification function for modifying diphthongs within words in the first enhance audio signal, and a right-channel echo cancellation function, wherein the first enhanced audio signal drives the left speaker, and implement a left channel for processing left input audio signals from the left microphone array and generating a second enhanced audio signal, the left channel including a left-channel beam forming function, a left-channel automatic gain control amplifier with thresholding, a left-channel adaptive filter, a left-channel attack/decay function, a left-channel diphthong modification function for modifying diphthongs within words in the second enhance audio signal, and a left-channel echo cancellation function, wherein the second enhanced audio signal drives the right speaker.

In certain embodiments, a voice enhancement device, includes a collar, at least two independently driven speakers positioned at opposite sides of an upper surface of the collar, at least two microphone arrays positioned at opposite sides of the upper surface of the collar, and an electronic controller supported by the collar and implementing at least two audio channels, each of the at least two audio channels receiving input audio signals from a different one of the at least two microphone arrays and generating, from the input audio signals, an enhance audio signal to drive a different one of the at least two independently driven speakers.

BRIEF DESCRIPTION OF THE FIGURES

Some embodiments of the present invention are illustrated as an example and are not limited by the figures of the accompanying drawings, in which like references may indicate similar elements and in which.

DETAILED DESCRIPTION OF THE EMBODIMENTS

The terminology used herein is for the purpose of describing particular embodiments only and is not intended to be limiting of the embodiments described herein. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification. Specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which the embodiments described herein belong. It will be further understood that terms, such as those defined in commonly used dictionaries, should be interpreted as having a meaning that is consistent with their meaning in the context of the relevant are and the present disclosure and will not be interpreted in an idealized of overly formal sense unless expressly so defined herein.

In describing the embodiments herein, it will be understood that a number of techniques and steps are disclosed. Each of these has individual benefits and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the embodiments herein and the claims.

Embodiments of a new device to detect, amplify, clarify and project the voice of a talker to a listener is discussed herein. In the following description, for the purposes of explanation, numerous specific details are set forth in order to provide a thorough understanding of the present embodiments herein. It will be evident, however, to one skilled in the art that the present embodiments herein may be practiced without these specific details.

The present disclosure is to be considered as an exemplification of the embodiments of a device to amplify and clarify voice, and is not intended to limit the invention to the specific embodiments illustrated by the figures or description below.

Figure 1:
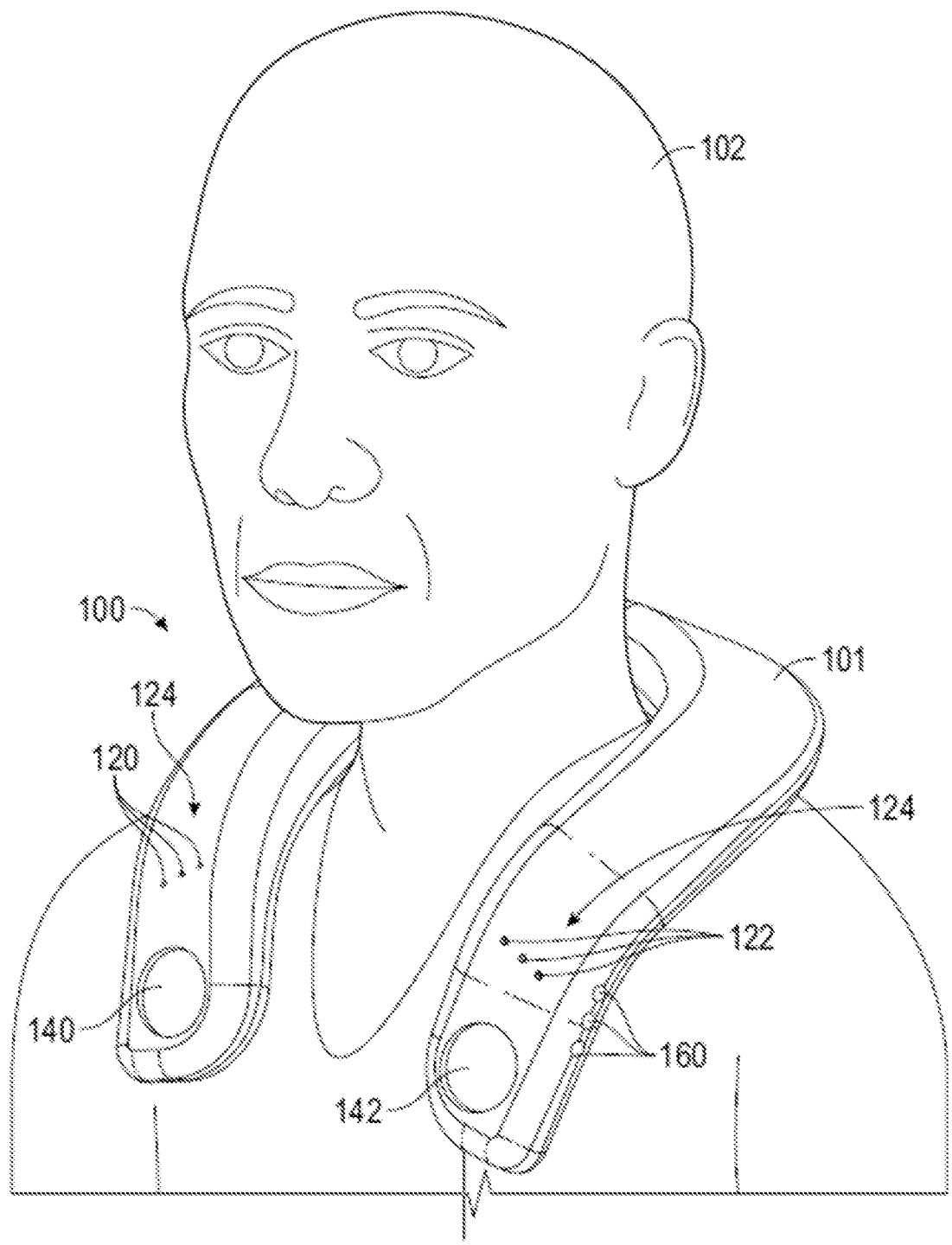
FIG. 1 is a perspective view showing a voice enhancement device being worn by a user, in an embodiment.

FIG. 1 is a perspective view showing a voice enhancement device 100 being worn by a user 102 (e.g., a patient or person suffering from hypophonia). Device 100 is a three-dimensional collar 101 that is shaped and sized to be comfortably worn by user 102 across their shoulders and around their neck. Collar 101 includes functional components that amplify and clarify a voice of user 102. In certain embodiments, collar 101 is formed of a rigid plastic. In other embodiments, collar 101 is formed of a soft malleable material such as a fabric, rubber, silicone, etc., that adapts its shape to fit over the shoulders of user 102. In certain embodiments, collar 101 is like a scarf and may be draped around the neck and shoulders of user 102, whereby collar 101 conforms to the neck and shoulders of user 102. Device 100 includes at least two microphone arrays 120 and 122, and two independently driven speakers 140 and 142, where right microphone array 120 and right speaker 140 are positioned at a right side of collar 101, and left microphone array 122 and left speaker 142 are positioned at a left side of collar 101. Advantageously, collar 101 positions microphone arrays 120 and 122 to capture the voice of user 102, and speakers 140 and 142 to output the voice of user 102 after amplification and clarification.

Figure 2:
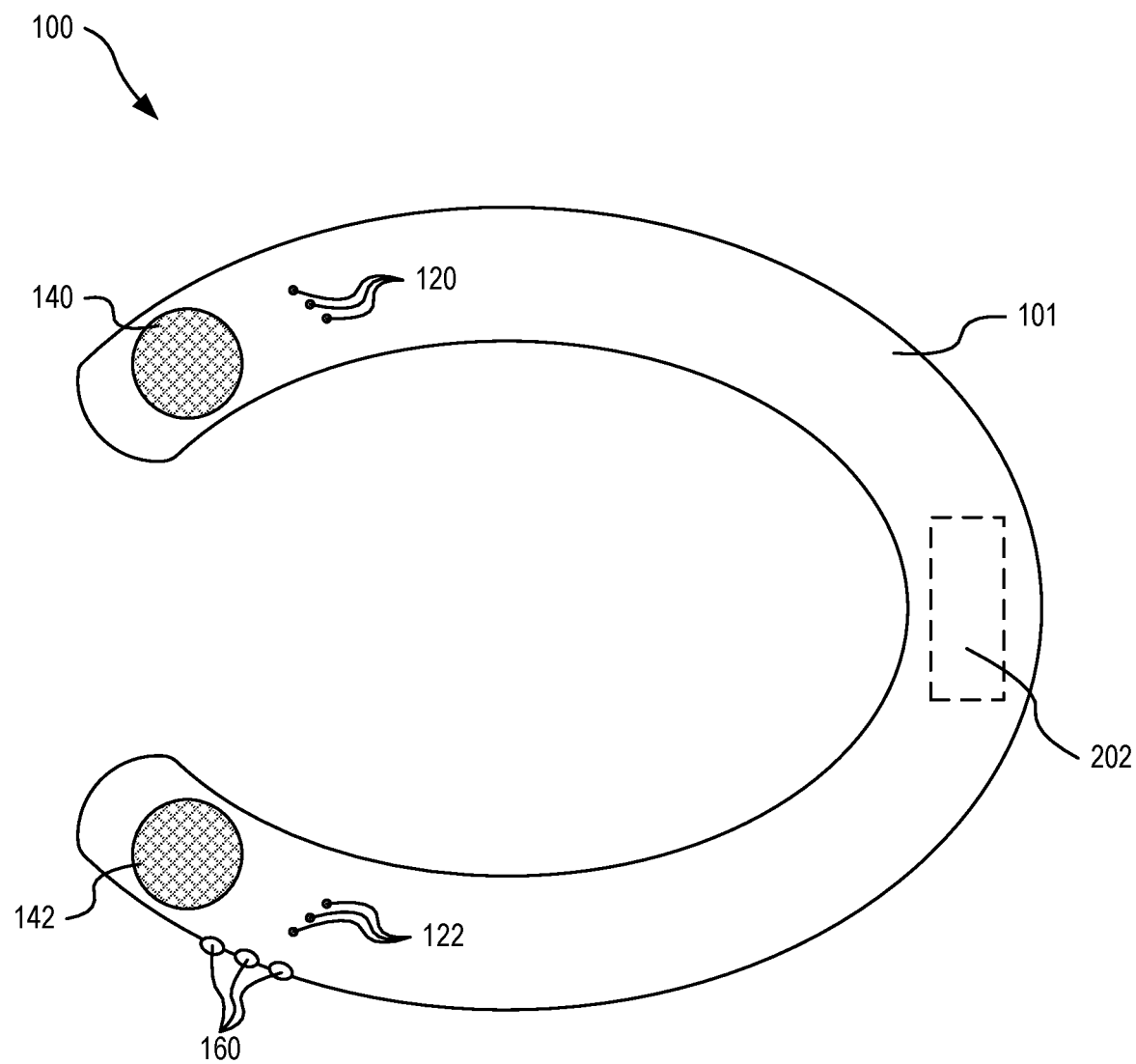
FIG. 2 is a top view schematic diagram illustrating the voice enhancement device of FIG. 1 in further example detail, in embodiments.
Figure 3:
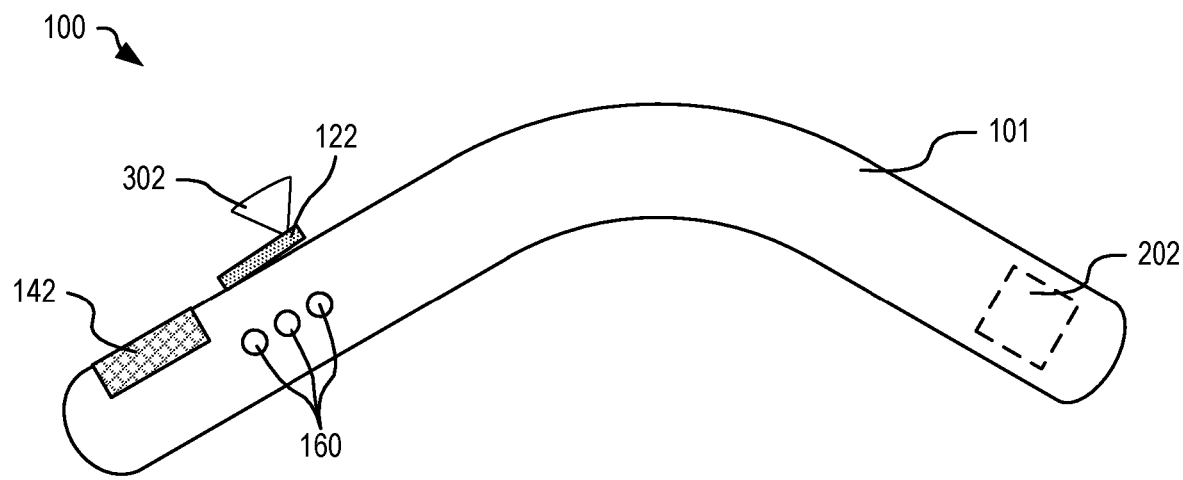
FIG. 3 is a side view schematic diagram illustrating the voice enhancement device of FIG. 1 in further example detail, in embodiments.

FIG. 2 is a top view schematic diagram illustrating voice enhancement device 100 of FIG. 1 in further example detail. FIG. 3 is a side view schematic diagram illustrating voice enhancement device 100 of FIG. 1 in further example detail. FIGS. 1, 2 and 3 are best viewed together with the following description. Speakers 140, 142 are positioned at distal ends of collar 101 to direct sounds output from speakers 140, 142 away from user 102 and in a direction that user 102 is facing. Although shown with two speakers 140, 142, device 100 may have fewer or more speakers without departing from the scope hereof In certain embodiments, speakers 140, 142 are rigidly mounted within collar 101. In other embodiments, one or both of speakers 140, 142 may be mounted using mechanical pivots that allow speakers 140, 142 to be rotated relative to collar 101. This allows speakers 140, 142 to be directed towards a listener, such as when the listener is situated besides user 102 in a vehicle or living room. In certain embodiments, collar 101 may include structure (e.g., a horn) that is adjustable to direct sound from speakers 140, 142. Directing of speakers 140, 142 and sound therefrom may also be included when collar 101 is formed of the soft malleable material.

Microphone arrays 120, 122 are positioned on a front upper surface 124 of collar 101 to capture sounds from a mouth of user 102. Each microphone array 120, 122 includes a plurality of microphones positioned at fixed distances and directions from each other. In the example of FIG. 1, each microphone array 120, 122 is shown as a linear arrangement of three microphones. Voice enhancement device 100 include an electronic controller 202 (see FIG. 2) that implements at least two audio channels (e.g., see channels 540 and 542 of FIG. 5) that each receive audio input signals from different ones of microphone arrays 120, and generate an enhanced audio signal to drive a different one of speakers 140 and 142. Electronic controller 202 processes the audio signals from each of the microphones to selectively capture sounds from the mouth of user 102 over background noise, and implements echo cancelling to attenuate sounds generated by speakers 140 and 142. In certain embodiments, a linear arrangement of microphone array 120 is positioned substantially perpendicular to speaker 140, and a linear arrangement of microphone array 122 is positioned substantially perpendicular to speaker 142. This arrangement results in maximum rejection of feedback. In certain embodiments, collar 101 may include one or more acoustically focusing elements 302 (e.g., acoustic structures, horns, etc.) that that focuses sound from the mouth of user 102 onto microphone arrays 120, 122, and shields microphone arrays 120, 122 from sounds generated by speakers 140, 142 and/or other background noise.

In the embodiment shown in FIG. 1, microphone arrays 120, 122 are embedded into collar 101. However, in other embodiments, microphone arrays 120, 122 may extend in a plane beyond the structure of collar 101. Since the distance between microphone array 120, 122 and corresponding speaker 140, 142, is critical to reduce feedback (e.g., howl), extending microphone arrays 120, 122 toward the mouth of user 102, such as by allowing one or both of microphone arrays 120, 122 to fold up from collar 101 and/or by extending a corresponding portion of collar 101 toward the mouth of user 102, are alternate embodiments.

Figure 4:
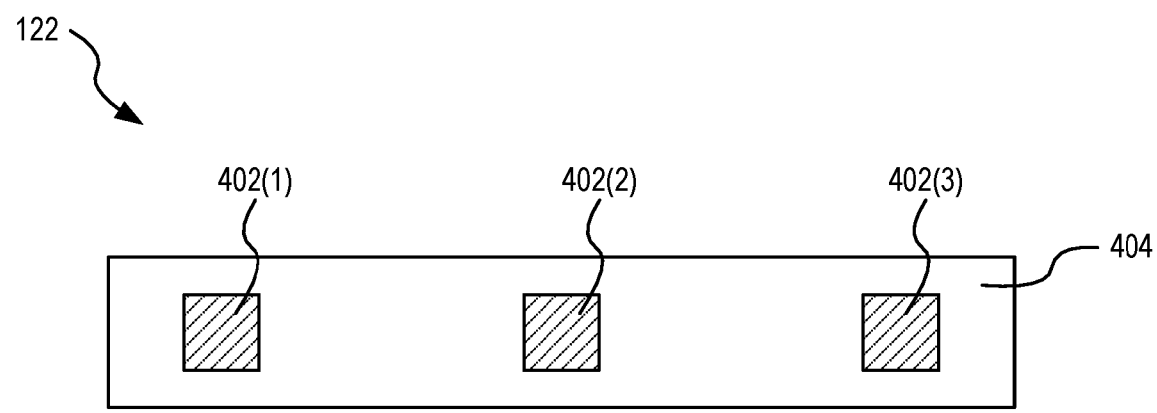
FIG. 4 is a schematic illustrating one microphone array of FIG. 1 in further example detail, in embodiments.

FIG. 4 is a schematic diagram illustrating microphone array 122 of FIG. 1 in further example detail. Microphone array 120 may be similar. In this embodiment, three microphones 402(1)-(3) are mounted on or in a plate 404 that is formed of one of a rigid plastic and/or a semi-flexible material, such as a flex circuit. The three microphones 402(1)-(3) may have a linear arrangement. Plate 404 may movably couple with collar 101 such that microphone array 122 may be positioned, relative to collar 101 and user 102, for desired operation of device 100. In certain embodiments, plate 404 couples at one end with collar 101 via a ball and socket joint that allows plate 404 to hinge and twist relative to collar 101. Plate 404 may movably couple with collar 101 in other ways, such as via a gooseneck, a twisting hinge, or using any other such connection, without departing from the scope hereof.

Figure 5:
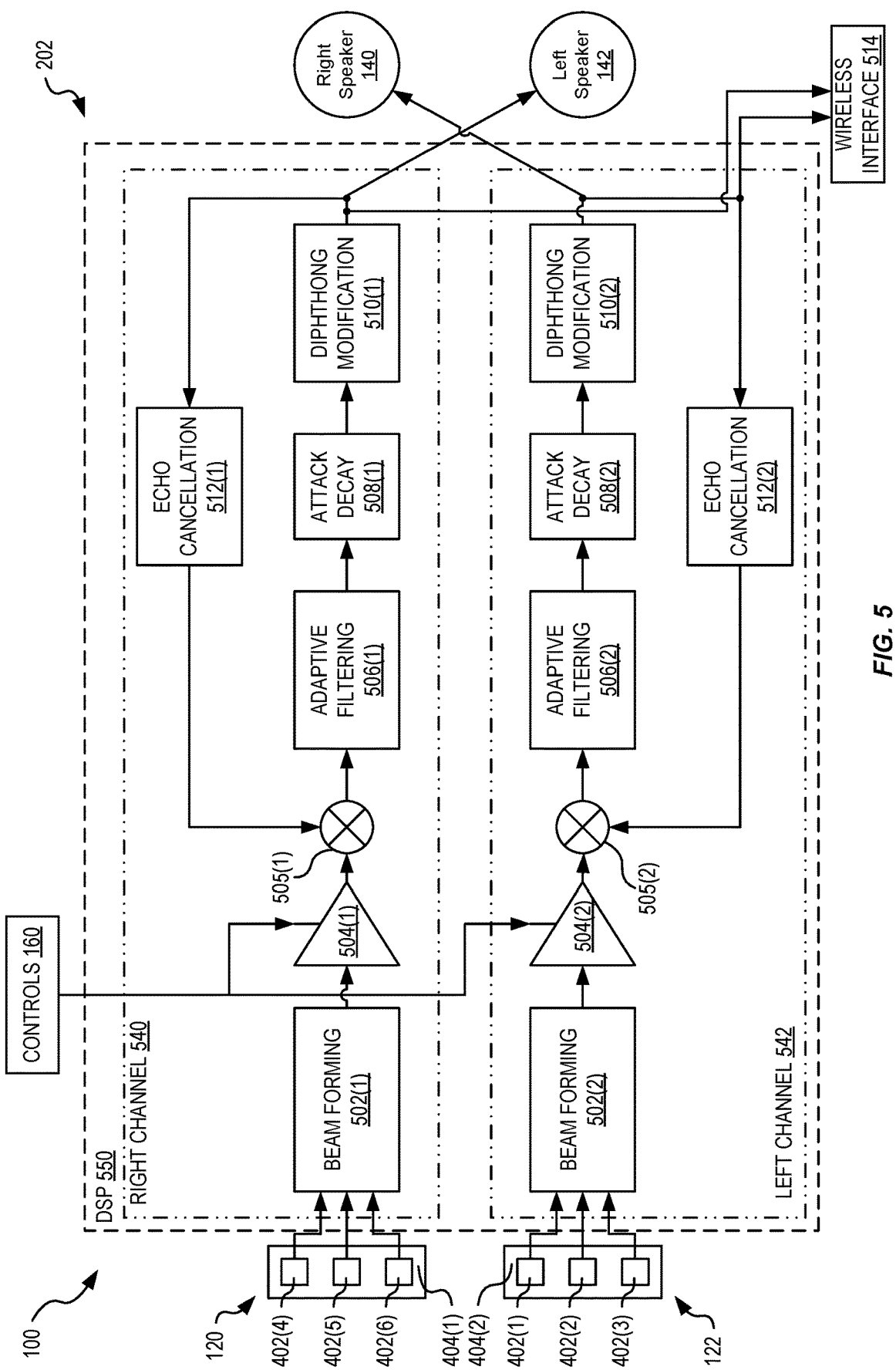
FIG. 5 is a functional block diagram showing example signal paths of the voice enhancement device of FIG. 1, and showing example components of the electronic controller of FIG. 2, in embodiments.

FIG. 5 is a functional block diagram showing example signal paths of voice enhancement device 100 of FIG. 1, and showing example components of electronic controller 202 of FIG. 2. Voice enhancement device 100 has two channels, a right channel 540 and a left channel 542. Right channel 540 includes right microphone array 120, beam forming function 502(1), automatic gain control (AGC) amplifier 504(1) with thresholding, at least one adaptive filter 506(1), an attack/decay function 508(1), a diphthong modification function 510(1) and echo cancellation function 512(1). However, output of right channel 540 crosses to drive left speaker 142. Left channel 542 includes left microphone array 122, beam forming function 502(2), AGC amplifier 504(2) with thresholding, at least one adaptive filter 506(2), an attack/decay function 508(2), a diphthong modification function 510(2) and echo cancellation function 512(2). Left channel 542 output crosses to drive right speaker 140.

Each microphone 402(4)-(6) of right microphone array 120 independently captures audio from user 102 and inputs corresponding audio signals to beam forming function 502 (1). The captured audio may be verbal utterances by user 102, for example. Each microphone 402(1)-(3) of left microphone array 122 independently captures audio from user 102 and inputs corresponding audio signals to beam forming function 502(2). In certain embodiments, beam forming function 502(1) and 502(2) are each implemented as a firmware function in a digital signal processor (DSP) 550, whereby the audio input signals from each microphone array 120, 122, are used to form a spatial filter that extracts audio from a specific direction, reducing the contamination of audio from other directions. For example, DSP 550 may include, or be connected to, memory that stores machine-readable instructions that, when executed by the DSP, cause the DSP to implement the functionality described herein.

Although not shown in FIG. 5, electronic controller 202 may also include at least two analog-to-digital converters (ADC) that each convert an analog audio signal (e.g., from microphones 402) into a digital format. In certain embodiments, microphones 402 include ADC functionality and output digital audio signals. In other embodiments, DSP 550 includes at least one ADC that converts analog audio signals from microphones 402 into digital audio signals.

Each AGC amplifier 504 with thresholding may also be implemented as a firmware function in DSP 550. AGC amplifier 504 automatically adjusts its gain to maintain its output at a reference level, where the reference level may be adjusted by controls 160. In certain embodiments, controls 160 are implemented as push buttons (e.g., one button for louder, one for quieter) that are input to DSP 550 to adjust the reference level. In other embodiments, controls 160 may include a dial that is turned to adjust the reference level. An enhanced audio signal output from the right channel AGC amplifier 504(1) is crossed to drive left speaker 142, and an enhanced audio signal output of the left channel AGC amplifier 504(2) is crossed to drive right speaker 140. By crossing the outputs of right channel 540 and left channel 542 to drive left speaker 142 and right speaker 140, respectively, additional physical distance between microphone arrays 120 and 122 and corresponding driven speakers 142 and 140, respectively, is increased to reduce feedback (e.g., the tendency to howl). Adaptive filter 506 detects noise by performing a fast Fourier transform while user 102 is not speaking and controls one or more adjustable notch filters to filter out any detected noise. For example, the fast Fourier transform may also be used to detect when the voice of user 102 is not present. In certain embodiments, adaptive filter 506 is implemented as a firmware function in the DSP 550; however, adaptive filter 506 may be implemented in other ways, such as by using discrete electrical components and circuitry.

Attack/Decay functions 508 each operate independently to change the amplitude of a word in the enhanced audio signal. For example, where user 102 has a neurological disorder, user 102 may modulate the amplitude of one or more spoken words (e.g., during each word). Attack/decay function 508 automatically varies the gain of the audio signal quickly within the word. In certain embodiments, attack/decay function 508 is implemented as a firmware function in DSP 550. Diphthong Modification function 510 is an artificial intelligence algorithm that processes the audio signal to modify diphthongs within a word to improve intelligibility of the word in the enhanced audio signal. Diphthong Modification function 510 may be implemented as a firmware function in DSP 550.

Echo cancellation function 512(1) and 512(2) feeds at least part of the enhanced audio output signal that drives the speaker back to a corresponding summing junction 505(1) and 505(2), respectively, in the audio path. In the embodiment of FIG. 5, each summing junction 505(1) and 505(2) is shown before the corresponding adaptive filter 506(1) and 506(2), but could be positioned after beam forming function 502(2) and 502(1) and prior to AGC amplifier 504(2) and 504(1), respectively, without departing from the scope hereof. In other embodiments, the feedback may be crossed such that the feedback signal from echo cancellation function 512(1) is input to summing junction 505(2) and the feedback signal from echo cancellation function 512(2) is input to summing junction 505(1).

In the embodiment of FIG. 5, the modification of the voice of the talker is performed with firmware functions of DSP 550. In other embodiments, functions of DSP 550 may be performed by other computer chips, such as an ARM microprocessor. In yet other embodiments, functions of DSP 550 may be performed with discrete components and/or integrated circuitry.

In certain embodiments, voice enhancement device 100 may include one or more wireless interfaces 514 (e.g., Bluetooth) that communicate the enhanced audio signal to other devices, such as a cell phone and/or mobile speaker. For example, where the enhanced audio signal is communicated to a cell phone, voice enhancement device 100 improves the ability of user 102 to communicate via the cell phone.

Figure 6:
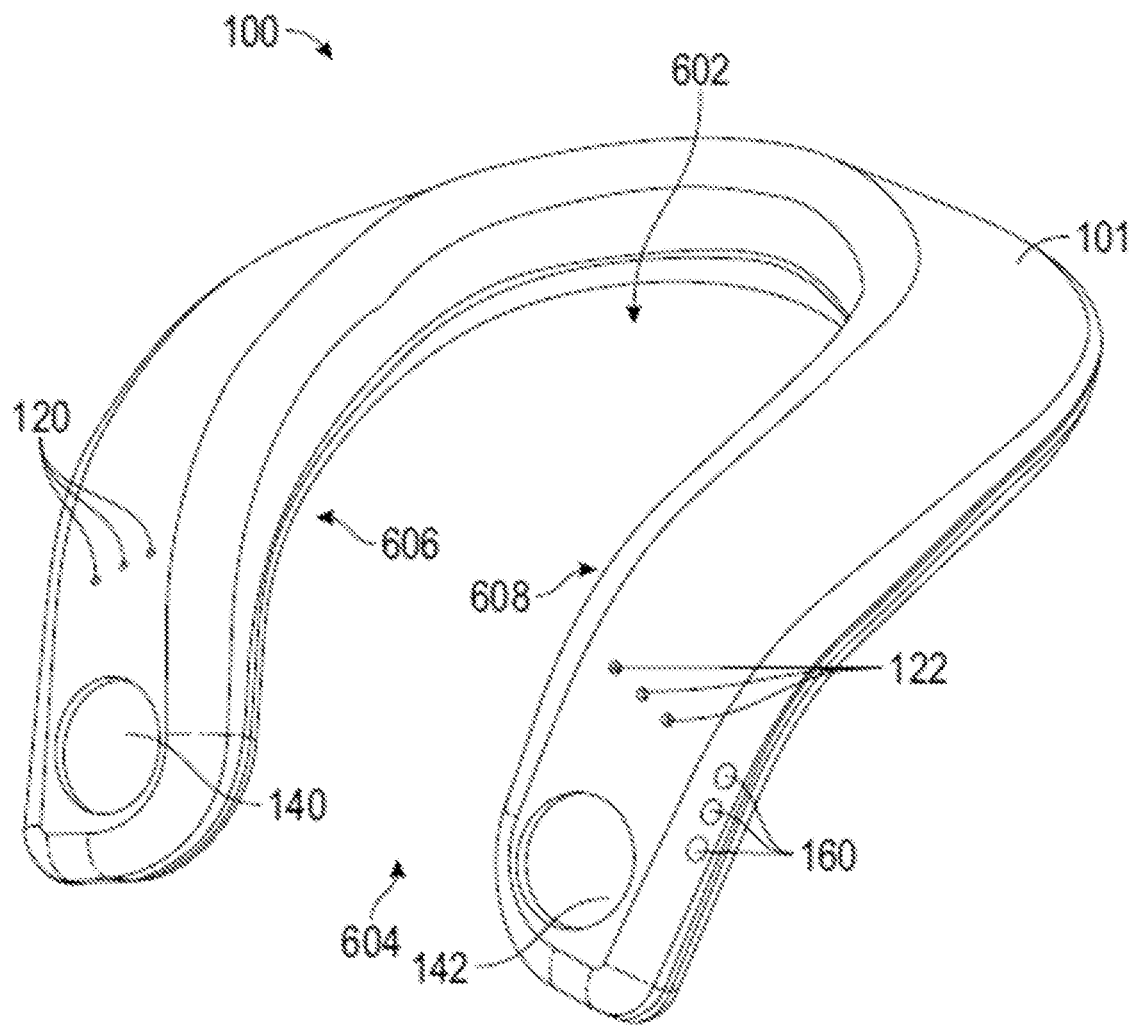
FIG. 6 is a perspective view of the voice enhancement device of FIG. 1, in embodiments.
Figure 7:
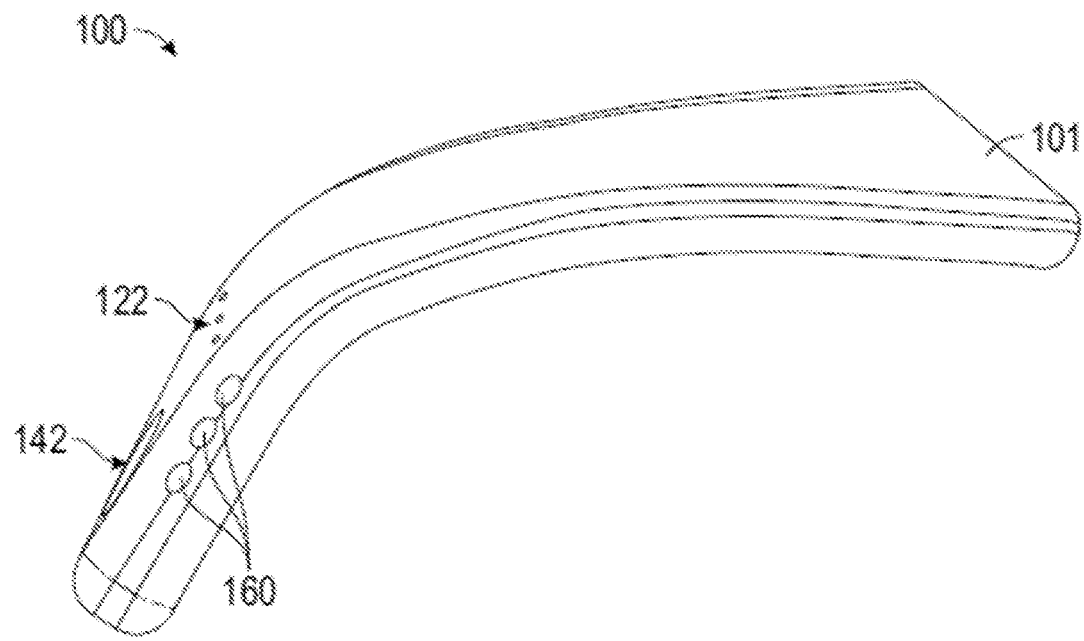
FIG. 7 is a side view of the voice enhancement device of FIG. 1, in embodiments.
Figure 8:
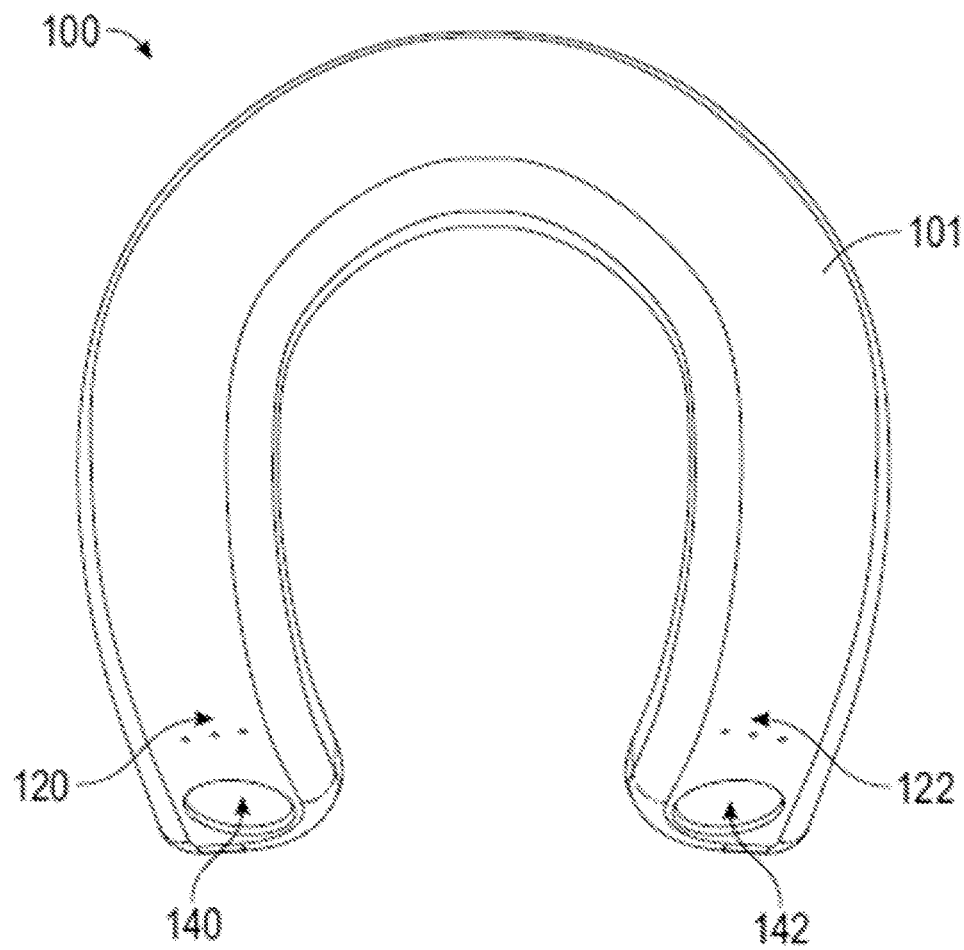
FIG. 8 is a plan view of the voice enhancement device of FIG. 1, in embodiments.
Figure 9:
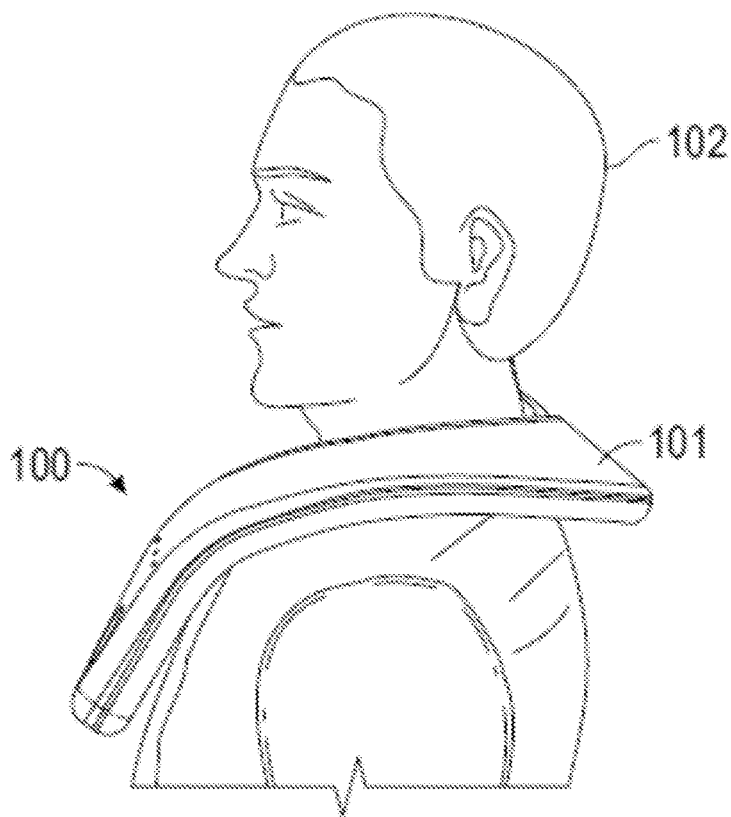
FIG. 9 is a side view of the voice enhancement device of FIG. 1 being worn by the user, in embodiments.
Figure 10:
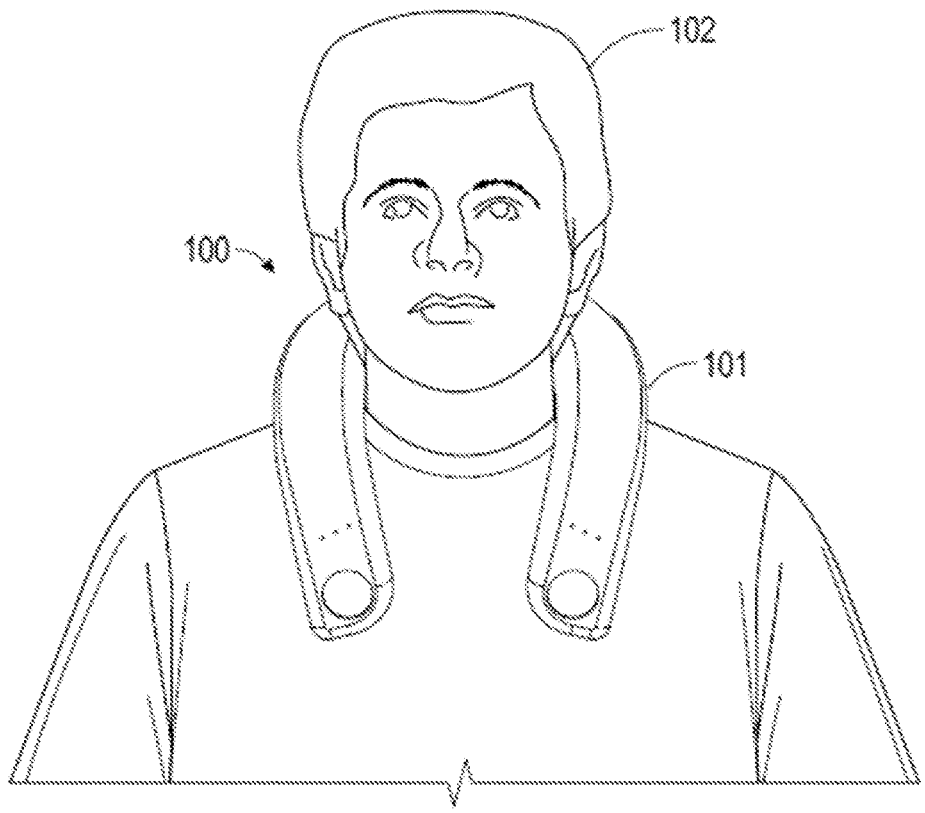
FIG. 10 is a front view of the voice enhancement device of FIG. 1 being worn by the user, in embodiments.

FIG. 6 is a perspective view of voice enhancement device 100 of FIG. 1. FIG. 7 is a side view of voice enhancement device 100 of FIG. 1. FIG. 8 is a plan view of voice enhancement device 100 of FIG. 1. FIG. 9 is a side view of voice enhancement device 100 of FIG. 1 being worn by user 102. FIG. 10 is a front view of voice enhancement device 100 of FIG. 1 being worn by user 102. FIGS. 6 through 10 are best viewed together with the following description. As described above, collar 101 may be formed of a rigid plastic or of a soft malleable material such as a fabric, rubber, silicone, etc., that adapts its shape to fit over the shoulders of user 102. Advantageously, collar 101 is shaped, or may be shaped by user 102, to comfortably rest on the shoulders of user 102, or when implemented in a scarf-like material, may be draped around the neck and shoulders of user 102. Collar 101 conforms to the neck and shoulders of user 102 and advantageously positions microphone arrays 120, 122 to capture audio from the mouth of user 102, and generate an enhance audio signal to provide an improved sound output from speakers 140 and 142.

Collar 101 has a central opening 602 and a front gap 604 between a right arm 606 and a left arm 608. Collar 101 is shaped and sized to comfortably sit and be retained about the neck and shoulders of user 102. More particularly, collar 101 is sized and shaped such that when front gap 604 is oriented towards the front of user 102, microphone arrays 120, and 122 are positioned in front of and beneath the mouth of user 102 and speakers 140 and 142 are oriented to emit sound in a direction that user 102 is facing. Advantageously, collar 101 consistently positions microphone arrays 120 and 122 close to the mouth of user 102, and is also easy to put on and take off, even for people with mobility limitations.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," "left," and "right," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A voice enhancement device, comprising:
a collar defining a central opening and a front gap between a right arm and a left arm, the collar being shaped and sized to comfortably sit and be retained about a neck and shoulders of a user of the voice enhancement device;
a right speaker positioned at a right upper surface of a right distal end of the right arm;
a left speaker positioned at a left upper surface of a left distal end of the left arm;

a right microphone array including a plurality of right microphones positioned at the right upper surface of the right arm;

a left microphone array including a plurality of left microphones positioned at the left upper surface of the left arm; and an electronic controller housed within the collar and comprising:

at least one digital signal processor (DSP); and memory storing machine-readable instructions that when executed by the DSP, control the DSP to:

implement a right channel for processing right input audio signals from the right microphone array and generating a first enhanced audio signal, the right channel including a right-channel beam forming function, a right-channel automatic gain control amplifier with thresholding, a right-channel adaptive filter, a right-channel attack/decay function, a right-channel diphthong modification function for modifying diphthongs within words in the first enhance audio signal, and a right-channel echo cancellation function, wherein the first enhanced audio signal drives the left speaker; and implement a left channel for processing left input audio signals from the left microphone array and generating a second enhanced audio signal, the left channel including a left-channel beam forming function, a left-channel automatic gain control amplifier with thresholding, a left-channel adaptive filter, a left-channel attack and decay function, a left-channel diphthong modification function for modifying diphthongs within words in the second enhance audio signal, and a left-channel echo cancellation function, wherein the second enhanced audio signal drives the right speaker.

2. A voice enhancement device, comprising:

a collar;

at least two independently driven speakers positioned at opposite sides of an upper surface of the collar;

at least two microphone arrays positioned at opposite sides of the upper surface of the collar; and an electronic controller supported by the collar and implementing at least two audio channels, each of the at least two audio channels receiving input audio signals from a different one of the at least two microphone arrays and generating, from the input audio signals, an enhance audio signal to drive a different one of the at least two independently driven speakers, each of the at least two audio channels having:

an attack and decay function for adjusting amplitude of words in the captured audio signal;

a diphthong modification function for improving clarity of the words in the enhanced audio signal; and an echo cancellation function for attenuating feedback of sound generated by a corresponding one of the two independent driven speakers.

3. The voice enhancement device of claim 2, the collar defining a central opening and a front gap between a right arm and a left arm, the collar being shaped and sized to comfortably sit about a neck and shoulders of a user of the voice enhancement device.

4. The voice enhancement device of claim 2, the collar comprising one of (a) a rigid plastic material, and (b) a malleable material.

5. The voice enhancement device of claim 2, each of the at least two audio channels further having at least one of:

a beam forming function for selectively capturing audio from the input audio signals;

an automatic gain control (AGC) amplifier with thresholding for amplifying the captured audio signal; and an adaptive filter for filtering the captured audio signal.

6. The voice enhancement device of claim 5, the input audio signals from a first of the at least two microphone arrays being used to generate the enhance audio signal to drive the one of the at least two speakers positioned on an opposite side of the collar from the first of the at least two microphone arrays.

7. The voice enhancement device of claim 5, the beam forming function processing the input audio signals captured by a plurality of microphones of a corresponding one of the at least two microphone arrays to capture selective audio from a desired direction.

8. The voice enhancement device of claim 7, the beam forming function using the plurality of microphones to form a spatial filter that extracts selective audio from the desired direction and reduces contamination of the selective audio by audio received from other directions.

9. The voice enhancement device of claim 5, the AGC amplifier with thresholding automatically amplifying the captured audio to maintain a reference level defined by a user of the voice enhancement device.

10. The voice enhancement device of claim 9, the collar further comprising controls for adjusting the reference level.

11. The voice enhancement device of claim 5, the at least one adaptive filter implementing a fast Fourier transform to detect noise and controlling at least one notch filter to filter the captured audio signal to reduce the noise.

12. The voice enhancement device of claim 2 the attack and decay function changing an amplitude of the enhanced audio signal corresponding to words in the captured audio signal.

13. The voice enhancement device of claim 2 the diphthong modification function modifying portions of the enhanced audio signal corresponding to diphthongs within the words in the captured audio signal.

14. The voice enhancement device of claim 2, the echo cancellation function generating a feedback signal based on the enhance audio signal.

15. The voice enhancement device of claim 5, the electronic controller comprising a digital signal processor, wherein the beam forming function, the AGC amplifier with thresholding, the adaptive filter, the attack and decay function, the diphthong modification function, and the echo cancellation function, are implemented as machine-readable instructions executable by the digital signal processor.

16. The voice enhancement device of claim 2, each of the at least two microphone arrays being positioned on a plate that is movably coupled with the collar.

17. The voice enhancement device of claim 16, the plate and the collar being coupled via a ball and socket joint.

18. The voice enhancement device of claim 2, the collar comprising at least one acoustically focusing element to focus sound from a mouth of a user of the voice enhancement device onto the at least two microphone arrays.

19. The voice enhancement device of claim 2, further comprising a wireless interface for communicating the enhance audio signal to a separate device.

20. The voice enhancement device of claim 2, wherein each of the at least two speakers are moveably mounted to the collar such that audio output of the at least two speakers may be direct by a user of the voice enhancement device.

* * * * *